United States Patent [19]

Horwath et al.

[11] 3,885,877

[45] May 27, 1975

[54] ELECTRO-OPTICAL FINE ALIGNMENT PROCESS

[75] Inventors: Ronald S. Horwath, Salt Point; George A. Kolb, Wappinger Falls, both of N.Y.

[73] Assignee: International Business Machines Corporation, Armonk, N.Y.

[22] Filed: Oct. 11, 1973

[21] Appl. No.: 405,347

[52] U.S. Cl. ................ 356/172; 356/152; 96/36.2; 156/11; 156/17

[51] Int. Cl. ........................................ G01b 11/26

[58] Field of Search ............. 356/152, 36, 38, 172; 156/11, 17; 96/36.2

[56] References Cited

UNITED STATES PATENTS

| | | | |
|---|---|---|---|
| 3,622,319 | 11/1971 | Sharp | 96/36.2 |
| 3,796,497 | 3/1974 | Mathisen | 356/152 |
| 3,802,940 | 4/1974 | Villers et al. | 156/17 |

*Primary Examiner*—Ronald L. Wibert
*Assistant Examiner*—Paul K. Godwin
*Attorney, Agent, or Firm*—David M. Bunnell

[57] ABSTRACT

Consistent optical signals are produced for an electro-optical fine alignment system by the use of an overcoating. The overcoating is reflective at the alignment wave lengths so that the coating acts to present a new relief image to the alignment optics.

9 Claims, 8 Drawing Figures

PRIOR TO COATING

AFTER COATING

ELECTRO-OPTICAL FINE ALIGNMENT PROCESS

BACKGROUND OF THE INVENTION

This invention relates generally to the electro-optical alignment of objects and more particularly to a process for the automatic alignment of two objects such as an exposure mask and a semiconductor wafer for photoresist exposure.

Automatic alignment systems, such as those used for the alignment of resist coated semiconductor wafers and exposure masks, use electrical signals which are generated by light which is reflected from or transmitted by corresponding alignment patterns on each of the objects. In the production of semiconductor devices, a series of photoresist masking steps is accomplished with each step requiring precise alignment with the preceding step. The alignment marks are formed, for example, as a relief image which is etched into the top layer of a semiconductor wafer during the first photoresist exposure and etching process. In this process a semiconductor wafer, which usually has an oxide coating on its surface, is coated with a resist and the resist is exposed through a first level mask which contains the desired device patterns and alignment patterns. The resist is then developed to remove portions of the resist layer and the oxide layer is etched in the areas from which the resist has been removed. The resulting alignment patterns are in the form of relief images which are etched into the oxide layer. These patterns are used for each subsequent alignment step in the semiconductor device manufacturing process. In each step, the alignment patterns are covered by the photoresist layer which is to be exposed and by various layers of dielectric materials such as are formed during semiconductor device manufacture, for example, oxides and nitrides. Where the alignment system uses a coherent monochromatic light source of a different wave length than the source used for photoresist exposure, inherent difficulties can result. Foremost is the variation in optical signal amplitude due to optical interference phenomena occuring within the thin dielectric layers which are present on the semiconductor surface. These dielectric films, which vary in thickness and structure, form a complex optical path through which the alignment illumination must pass. The resulting distortions and perturbations lead to alignment signals which are sometimes inadequate to effect proper mask and wafer alignment. The result is a reduction in the yield of useful devices. A process has now been found which minimizes concern with the overlying films, their structure and/or their thickness.

BRIEF SUMMARY OF THE INVENTION

In accordance with this invention, consistent optical signals are obtained for alignment purposes by the application of an optically selective overcoating. The overcoating is selected to be reflective at the alignment wave lengths so that it has the effect of presenting a new relief image to the alignment optics due to the reflection of the alignment light form the surface of the coating. Interfering reflections from the under layers are suppressed or eliminated by the reflective and absorptive properties of the overcoating material. Where the overcoat is placed over photoresist, it is selected to transmit the wavelengths required to expose the photoresist.

DETAILED DESCRIPTION

Figure 1:
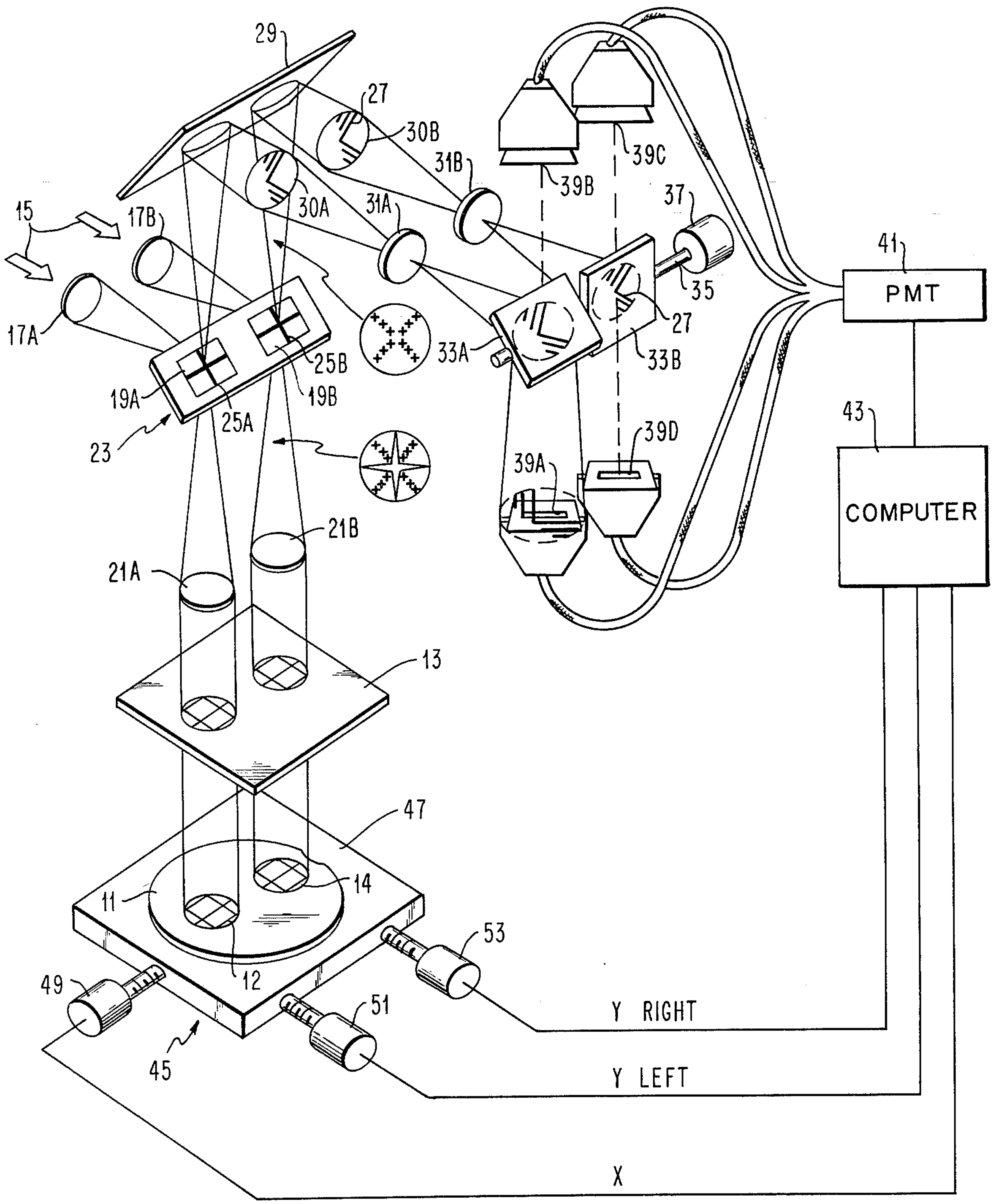
FIG. 1 is a schematic view illustrating a mask to wafer alignment system which can be used in the practice of the process of the invention.

Turning now to FIG. 1 there is illustrated an example of an alignment system which uses a monochromatic light source for the alignment illumination. The system is more fully described in co-pending application Ser. No. 203,736, filed Dec. 1, 1971 and now U.S. Pat. No. 3,796,497, entitled OPTICAL ALIGNMENT METHOD AND APPARATUS. A work piece, in this instance a semiconductor wafer 11, which is coated with a layer of photoresist for exposure through a pattern mask 13, is illuminated at two points 12 and 14 by a monochromatic collimated light source 15. The light for the alignment is selected so that premature exposure of the photoresist will not occur. The light is passed through condensing lenses 17A and 17B and reflected from combination half silvered mirror-filters 19A and 19B through objective lenses 21A and 21B and reflected from the surface of wafer 11 back through lenses 21A and 21B which image a Fraunhofer defraction pattern at their back focal or frequency plane 23 where half silvered mirror-filters 19A and 19B are located. The opaque areas 25A and 25B on filters 19A and 19B block all of the X–Y lines from the device patterns and pass substantially only the image of the lines 27 from the alignment pattern. The filtered images are reflected from mirror 29 to form magnified special images of line 27 at 30A and 30B which are further magnified by lenses 31A and 31B and reflected from first surfaced mirrors 33A and 33B which are mounted on shaft 35 which is rotated by motor 37. Together, lenses 21A and 21B and 31A and 31B form the elements of two compound microscopes. The images of the lines are scanned across slits 39A, 39B, 39C and 39D by rotating mirrors 33A and 33B. Each slit is located parallel to the lines of the pattern which it is scanning to provide for maximun sensitivity. Fiber bundles oriented parallel to the sensed lines are used to transport the images to photomultiplier tube 41.

Photomultiplier tube 41 produces signals when the image of a line crosses the respective slits. In this case, alignment patterns which each have two groups of three parallel lines with different spacing are used to generate each group of signals. The correct time of line crossing is determined by signal frequency changes detected by computer 43. The reference time 0 is repeatably determined by an optical coder (not shown) on shaft 35 which starts counters (not shown) counting from 0 at the same point on each rotation of shaft 35. The times are recorded and stored in computer 43. The position of the wafer 11 is then calculated and stored. The same process is repeated for mask 13 which is positioned above wafer 11 in a suitable holder (not shown) and held stationary. The wafer 11 is then moved so that the signals generated by wafer 11 agree with those of mask 13. Indexing table 45 is used to position wafer 11. Table 45 comprises a platen 47 which is mounted for rotation about two points by roller bearings (not shown). Servo motors 49, 51 and 53 which are controlled by computer 43 incremently move wafer 11 until the signals generated by the alignment lines 27 on wafer 11 agree, within selected tolerances, to corresponding lines on mask 13. The resist layer of wafer 11 is then exposed through the mask 13 in a conventional manner.

It should be understood that the above described system is illustrative of an example of a system in which the process of the invention can be used and it is included for the purposes of illustration only as it will be understood by those skilled in the art that the process of the invention would be useful in other systems where the generation of electrical alignment signals by the reflection of light from relief patterns is employed.

Figure 2:
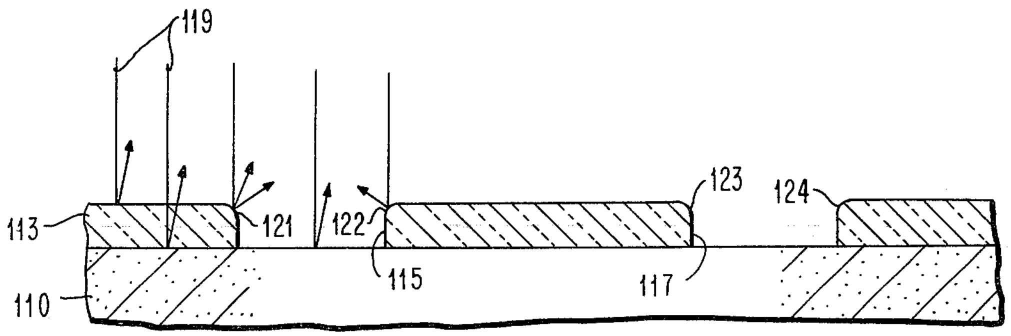
FIG. 2 is a cross sectional view with parts broken away illustrating alignment light rays striking a semiconductor material coated with an oxide layer in which is etched an alignment pattern.
Figure 3:
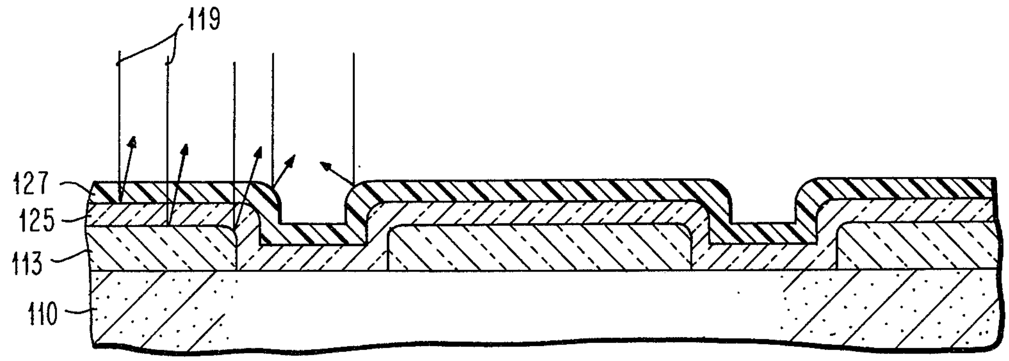
FIG. 3 is a cross sectional view illustrating alignment light rays striking the oxide coated semiconductor structure of FIG. 2 which has additional layers of oxide and photoresist.
Figure 4:
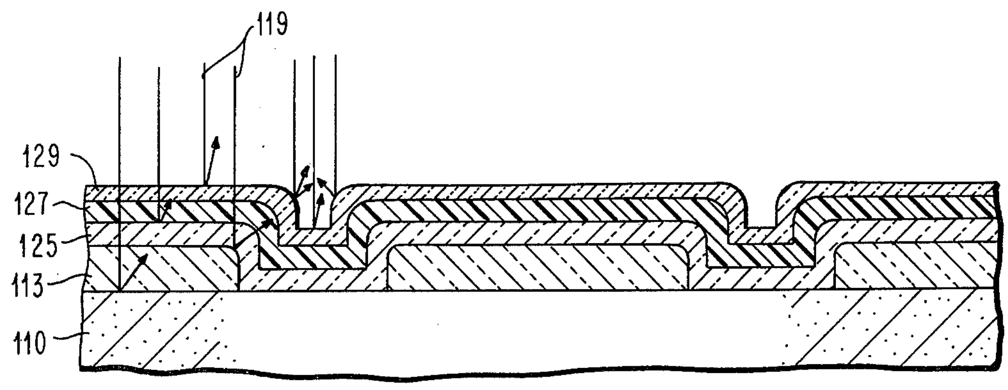
FIG. 4 is a cross sectional view illustrating alignment light rays striking the semiconductor structure of FIG. 3 to which has been added an overcoating according to an embodiment of the process of the invention.

FIGS. 2 to 4 illustrate the problems which can be encountered in generating alignment signals in a semiconductor device manufacturing process along with the solution achieved by the process of the invention. As shown in FIG. 2 silicon semiconductor wafer 110 is coated with a layer 113 of silicon dioxide. Alignment marks 115 and 117 are etched into layer 113 to produce a relief image. Rays 119 represent light from a monochromatic collimated alignment radiation source which are reflected from wafer 110. The diffraction of the light rays striking edges 121, 122, 123 and 124 causes a change in light intensity so that a photodetector will produce signals of a different amplitude when the images of the relief patterns are scanned past the photodetector as illustrated in FIG. 1. These signals, in conjunction with similar signals produced by light striking the alignment patterns on the mask, are then used as described, for example, in FIG. 1 to correctly position the mask and the wafer.

FIG. 3 illustrates the problems which arise when the alignment light must pass through a photoresist layer 127 and an additional dielectric layer 125. Reflections of light rays 119 from the various surfaces and corners, produce a complex optical path for the impinging rays and interference occurs between rays. The structure of each wafer being processed will vary to some extent and in some cases the light intensity changes from the alignment marks become so indistinct that usable signals are not produced by the photodetector.

FIG. 4 illustrates the structure shown in FIG. 3 to which is added a coating 129 according to the process of the invention. The coating is placed on the surface of resist layer 127. The coating thickness is selected so as to maintain the relief contour of the alignment marks 115 and 117. The material of coating 129 is selected to have the property of reflecting sufficient alignment light from its surface back to the alignment optics so that a useful signal is generated. At the same time the remainder of the impinging alignment light which succeeds in penetrating into or through layer 129 is absorbed within layers 129, 127, 125 and 113 of the structure. Consequently, any light other than that reflected from the surface of layer 129 is of such low intensity that it does not adversely effect the signal produced by the photo detector. The net effect of the coating 129 is to present a fresh relief reflective surface to the alignment optics. The material of coating 129 is also chosen so that it will transmit light of the wave lengths which are used to expose the photoresist layer 127 after the alignment has been completed.

The types of overcoating material which can be employed in the process of the invention include both organic and inorganic compounds. Particularly useful materials are organic dyes, for example, Rhodamine B, erythrosin, Wasser blau, and Sudan II. Rhodamine B is a red fluorescent dye with a color index number 45170 and the formula $C_{28}H_{31}ClN_2O_3$. Coatings of metal such as aluminum, gold, and silver can also be employed. The particular choice of material will depend upon a number of factors including the wave lengths of light which are to be used for alignment and, where photoresist processing is involved, the wave lengths of light to be used for resist exposure.

The coatings must be sufficiently reflective to produce useful signals in any given system. In other words, the more sensitive the system the less reflective the coating need be. The material must also be sufficiently opaque at the alignment wave lengths so that it will absorb any residual light which penetrates the coating and is reflected back to the coating. Where photoresist processing is involved, the transmission at the exposure wave lengths should be sufficiently high so that resist exposure can be obtained without unduly long exposure times. Transparency is not a factor where resist exposure is not involved or where the overcoating material is placed beneath the resist layer. Ideally, a coating would be 100% reflective at the alignment wave lengths and 100% transmissive at the resist exposure wave lengths.

Based on the above criteria those skilled in the art can readily select suitable coating materials for any given system. For example, with the system described in FIG. 1 it has been found that Rhodamine B which has a reflectance of about 16% at the alignment wave length of 5145A, a percent absorption of about 54% at 5145A and a percent transmittance at the exposure wave length of 4358A of about 85% is useful.

The coatings are applied by conventional methods from solvent solutions such as by dipping or spinning and, in the case of metals, by evaporation or plating. The optical properties will vary depending upon the layer thickness. For example, the reflectance of Rhodamine B varies from about 20% at a thickness of 500 A to about 15% at a thickness of 2,000A at a wavelength of 5145A. Coating thickness having a magnitude of from about 500A to about 2,000A have been found to provide sufficient absorption and refectance at alignment wave lengths without adversely affecting either the contour of the relief image needed to produce a change in light intensity for alignment or the transmittance needed to expose photoresist at the exposure wave lengths.

The optical properties of some representative overcoating materials are presented in table I below. The listed exposure wave lengths of 3650A and 4358A are the wave lengths conventionally employed with commercial positive and negative photoresists.

TABLE I

OPTICAL PROPERTIES OF OVERCOATING MATERIALS

| | | At Exposure Wavelengths - %Transmittance | | | At Alignment Wavelength | |
|---|---|---|---|---|---|---|
| | | 3650A | 4047A | 4358A | 5145A %Transmittance | 5145A %Reflectance |
| Material: | Thickness: | | | | | |
| Rhodamine B | 800A | 74 | 83 | 85 | 30 | 16 |
| Erythrosin | 800A | 82 | 89 | 89 | 28 | 24 |
| Aluminum | 50A | — | — | 35 | 29 | 58 |

Figure 5:
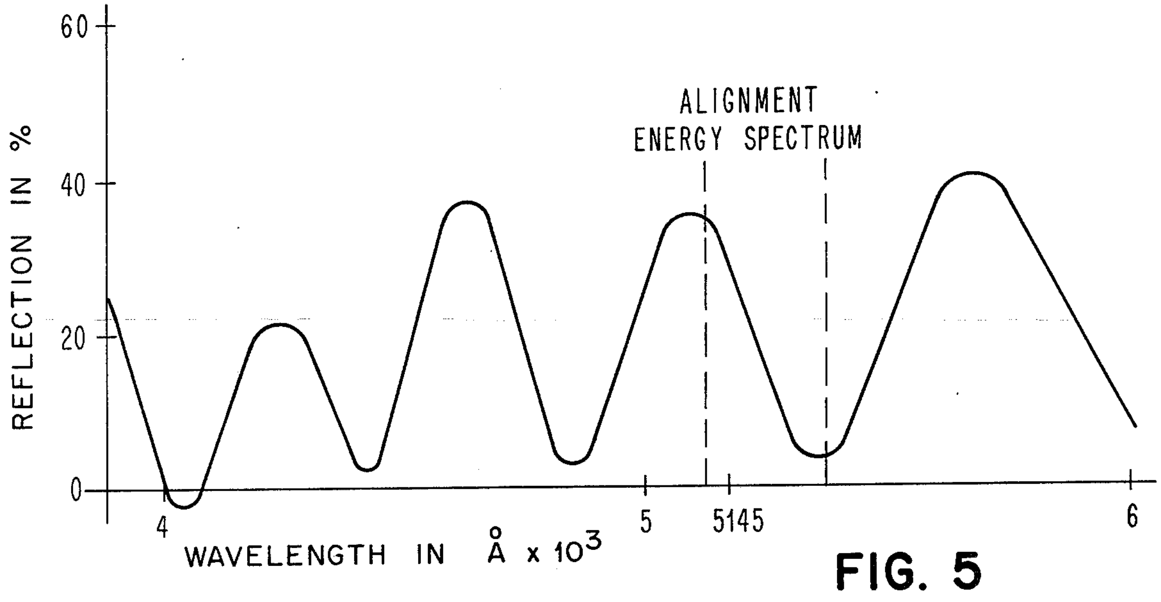
FIG. 5 is a graph illustrating percent reflection versus wave length for a silicon wafer coated with oxide and photoresist.
Figure 6:
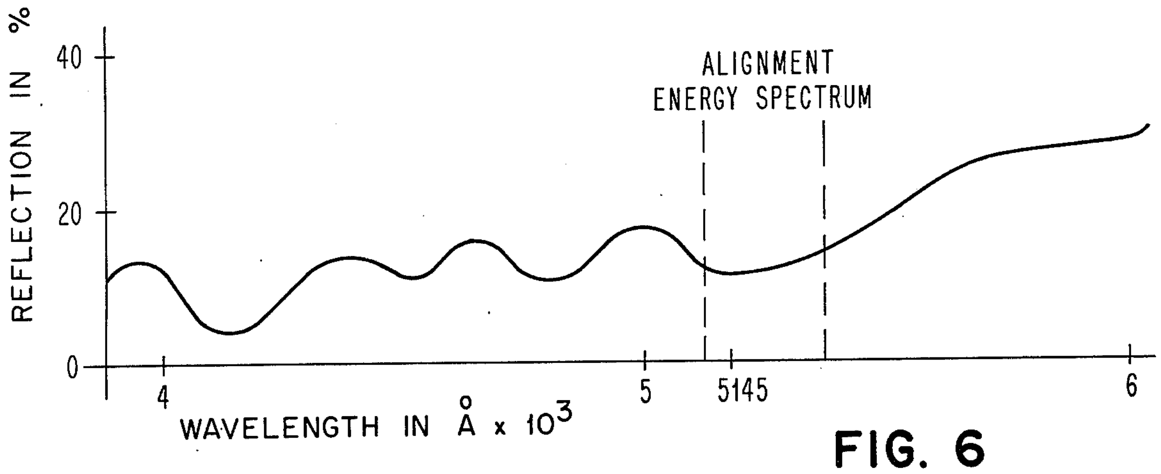
FIG. 6 is a graph illustrating percent reflection versus wave length for a silicon wafer coated with oxide, photoresist and an overcoating according to the process of the invention.

The graphs of FIGS. 5 and 6 illustrate an additional property of the overcoating process of the invention which acts to produce enhanced alignment signals. The first graph illustrates the reflectance of light from a silicon dioxide coated silicon wafer which is covered with photoresist the respective layer coatings being 10,000A of photoresist and 5,000A of oxide. FIG. 6 is a similar graph where the photoresist has been overcoated with an 800A thickness of Rhodamine B. The dashed vertical lines on the graphs define an alignment energy spectrum which, even in a monchromatic system, consists of a band of light of varying wave lengths. As shown by the slope of the reflectance curve within this region in FIG. 5 the reflection energy varies. In contrast, as illustrated in FIG. 6, the energy spectrum is almost constant in this region for the overcoated structure. This then demonstrates the ability of the process of the invention to reduce periodic energy variations within the alignment energy spectrum.

EXAMPLE 1

Figure 7:
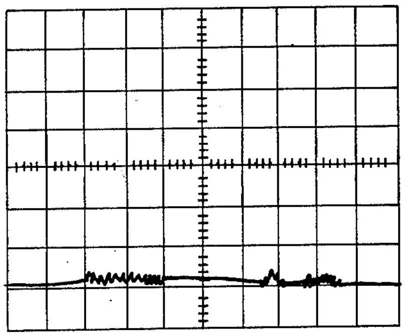
FIG. 7 is an oscilloscope trace illustrating alignment signals formed from a semiconductor wafer coated with oxide and photoresist.
Figure 8:
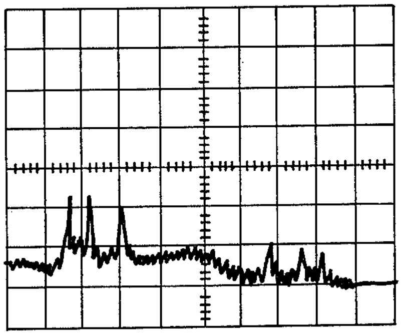
FIG. 8 is an oscilloscope trace showing alignment signals produced by the semiconductor wafer of FIG. 7 to which has been added an overcoating according to an embodiment of the process of the invention.

To further illustrate the improvements obtained in the alignment signal using the system illustrated in FIG. 1, silicon wafers were aligned with a mask for second level photoresist exposure. The silicon wafers were coated with a 5,000–6,000A thick silicon oxide layer into which were formed alignment patterns. The patterns comprised recessed portions of the oxide layer whose surface was about 2,000A lower than the surrounding oxide. Coated on the silicon dioxide layer was an approximately 10,000A thick coating of Shipley AZ 1350H resist to produce about a 900A step over the alignment patterns. Some samples produced in this manner gave satisfactory alignment signals. However, as illustrated in the photograph of an oscilloscope trace in FIG. 7, certain of the samples gave indistinct signals of very low amplitude which were isufficient to satisfactorily align the wafer with an exposure mask. The sample giving the indistinct signals illustrated in the photograph was then coated with about an 800A thick dry coating of Rhodamine B by spin coating a saturated solution of Rhodamine B in Isopropanol and removing the solvent. After the coating was dry, another attempt was made to align the sample wafer with the mask. The signals obtained are illustrated in FIG. 8. The great improvement of the signals as compared with FIG. 7 is apparent. The three peaks at the left represent the signals received from the alignment pattern on the wafer and the three peaks at the right, represent the signals produced by corresponding alignment marks on the mask. These signals are adequate to successfully align the mask and wafer for photoresist exposure using the system illustrated in FIG. 1.

While the invention has been particularly shown and described with reference to preferred embodiments thereof it will be understood by those skilled in the art that various changes in form and details may be made therein without departing from the spirit and scope of the invention.

What is claimed is:

1. In a process for aligning two objects by electro-optical means in which each of said objects have corresponding alignment patterns with the patterns on one of said objects being in the form of a relief image which is coated with a layer of photoresist; the alignment being accomplished by illuminating said patterns with coherent monochromatic light which is reflected from said relief image to produce images of said corresponding patterns; using said images to produce electrical signals which are indicative of the location of said patterns; and moving the objects relative to one another until the signals agree, the improvement which comprises coating on said resist layer a layer of material prior to illuminating said patterns which material absorbs and reflects said light such that only light reflected from said layer is used to generate said signals.

2. The process of claim 1 wherein said material is an organic dye.

3. The process of claim 2 wherein said dye is Rhodamine B.

4. In a process for aligning a resist coated semiconductor wafer during integrated circuit device manufacture with an exposure mask for resist exposure through said mask by electro-optical means in which the mask and wafer have corresponding alignment patterns with the patterns on the wafer being in the form of relief images, the alignment being accomplished by illuminating the patterns with coherent monochromatic light such that said light is reflected from the patterns on the wafer to produce images of the corresponding alignment patterns; using said images to produce electrical signals which are indicative of the location of said patterns; and then moving the mask and wafer relative to one another until the signals generated by the mask and wafer patterns agree, the improvement which comprises the step of coating a layer of material on top of the photoresist layer prior to illuminating said patterns which material reflects or absorbs the alignment light, such that only the reflected light is used in the alignment, and which material is transmissive of the exposure light so that photoresist exposure can occur through said layer.

5. The process of claim 4 in which said material is aluminum.

6. The process of claim 4 in which said material is Rhodamine B.

7. The process of claim 4 in which said material is erythrosin.

8. The process of claim 4 wherein said material is reflective at wavelengths above about 5,000A and transmissive of wavelength between about 3,500A and 4,500A.

9. The process of claim 2 wherein said material is coated in a thickness from about 500 to 2,000A.

* * * * *